United States Patent

DiStefano et al.

[15] 3,640,765

[45] Feb. 8, 1972

[54] SELECTIVE DEPOSITION OF METAL

[72] Inventors: Ralph David DiStefano, Mercerville; Edward Anthony James, Skillman, both of N.J.

[73] Assignee: RCA Corporation

[22] Filed: Aug. 6, 1969

[21] Appl. No.: 848,088

[52] U.S. Cl. ....................117/212, 96/36.2, 117/47 A

[51] Int. Cl. ....................G03c 5/00

[58] Field of Search ....................117/212, 47 A, 160; 96/36.2

[56] References Cited

UNITED STATES PATENTS

| | | | |
|---|---|---|---|
| 3,506,482 | 4/1970 | Hirohata et al. | 117/212 |
| 3,454,407 | 7/1969 | Möller et al. | 117/160 X |
| 3,443,988 | 5/1969 | McCormack | 117/212 |
| 3,376,139 | 4/1968 | Giangualano et al. | 96/36.2 |
| 3,269,861 | 8/1966 | Schneble | 117/213 |
| 3,119,709 | 1/1964 | Atkinson | 117/47 |
| 3,075,855 | 1/1963 | Agens | 117/212 X |

OTHER PUBLICATIONS

Coucoulas et al., "Selective Electroless Plating" Technical Digest No. 9 Jan. 1968 pp. 35-36

*Primary Examiner*—Ralph S. Kendall
*Assistant Examiner*—Alan Grimaldi
*Attorney*—Glenn H. Bruestle

[57] ABSTRACT

Method of selectively electrolessly depositing a metal of the type that can be deposited on a catalyst-treated substrate, on exposed substrate areas, only, of an insulating substrate which also has areas covered with a synthetic resin-type photoresist, comprising successively treating the entire surface with a sensitizing solution and with an activating solution each of which contains a small amount of an octyl phenol ethylene ethanol containing five to 13 ethylene oxide groups, and then treating the entire surface with a solution for electrolessly depositing the metal, whereby the metal deposits only on the exposed substrate areas and not on the photoresist.

4 Claims, No Drawings

SELECTIVE DEPOSITION OF METAL

BACKGROUND OF THE INVENTION

Patterns of electrical conductors on insulating substrates have been made by a number of different methods. One of these is to cover the substrate with a metal foil, then deposit a pattern of an etch-resist on all areas where a metal conductor is desired, and finally etch away the metal from all areas not covered with the resist. This method is adequate only for making printed circuits which do not have high resolution requirements. Moreover, a large amount of metal is either wasted or requires additional expense to recover it from the spent etching solution.

Other previously known methods utilize electrolytic or electroless deposition of metal instead of laminated metal foil. In one electroless deposition method, a pattern of resist is laid down on an insulating substrate. The entire surface, including both resist and exposed substrate areas, is treated with a sensitizer and an activator, and then the entire surface is treated with the metal depositing solution. Metal deposits both on the substrate and on the resist-covered areas and the resist with its metal coating is later removed to leave only the metal pattern on the substrate. In this method, the edges of the conductors have a tendency to be ragged and hence resolution is not as good as required for some uses.

Another electroless deposition method involves first sensitizing and activating the entire substrate surface before putting down a resist pattern. Then after putting down the resist pattern, the entire surface is treated with the electroless metal-depositing solution. In this method, metal deposits only on the sensitized and activated exposed substrate areas and not on the resist-covered areas. Resolution is excellent since the edges of the resist act as forms for the plating. But this method, also, has a serious disadvantage in that sensitization and activation of the substrate surface involves deposition of metal ions, usually palladium, thereon. This produces paths of relatively low resistivity between the deposited conductors and, if conductor spacing is very close, may cause electrical breakdown.

DESCRIPTION OF PREFERRED EMBODIMENT

EXAMPLE I

The invention will first be described in connection with deposition of a defined pattern of copper conductors on a ceramic plate. A beryllia ceramic plate is first scrub cleaned with an abrasive cleaner such as Ajax cleanser.

The cleaned substrate is then coated with a polyvinyl cinnamate type photoresist, such as KPR (Eastman Kodak Co.). After drying, the coated substrate is given a first bake in air at a temperature of about 65° C. for 2 hours. The substrate is then recoated with the photoresist and given a second bake at about 65° C. for 2 hours, followed by a 20 minute bake at about 90° C.

Next, the conducting pattern is defined by exposure to a carbon arc of other UV source through a master. Where the light strikes, the resist is hardened. The resist is then developed with a conventional developer to lay bare the substrate by removal of resist that was not exposed to light.

The substrate is then cleansed in an aqueous solution comprising 10 g. trisodium phosphate and 10 g. sodium hydroxide per liter. The treatment is preferably carried out at 55°–60° C. for at least 8 minutes. After this cleaning treatment, the substrate is thoroughly rinsed in water.

The substrate is next subjected to a two-step etching treatment to remove surface contaminants. The first of these steps is treatment with a 20–30 percent by weight aqueous solution of ammonium bifluoride at room temperature for about 5 minutes. After thorough rinsing in water, the substrate is treated for 3 minutes with an aqueous solution containing 8 percent by weight concentrated hydrofluoric acid and 20 percent by weight of ammonium fluoride.

After the etching treatment, the substrate is rinsed ultrasonically for 1 minute in water.

Next, the substrate is immersed in a sensitizing solution which has been modified so that the ceramic substrate is sensitized but not the resist. The sensitizing solution comprises 10 g. $SnCl_2 \cdot 2H_2O$, 10 ml. concentrated HCl and 2 drops of octyl phenol ethylene ethanol containing 12 or 13 ethylene oxide groups (Triton X–102).

Then the substrate is immersed in an activating solution which activates the ceramic substrate and not the resist. The activator solution comprises 1 percent by weight $PdCl_2 \cdot 2H_2O$ and contains 2 drops/100 ml. of octyl phenol ethylene ethanol containing 12 or 13 ethylene oxide groups. The latter substance in both the sensitizing solution and the activator solution limits the action of the sensitizing and activating material to the substrate in a manner not fully understood.

After rinsing the substrate once more ultrasonically in water, it is now immersed in an electroless plating bath.

In this example, the bath comprises:

| | |
|---|---|
| $Cu(NO_3)_2 \cdot 6H_2)$ | 15 g./l. |
| $NaHCO_3$ | 10 g./l. |
| Rochelle salt | 30 g./l. |
| NaOH | 20 g./l. |
| Formaldehyde (37 %) | 100 ml./l. |
| pH | 11.5 |
| Temperature | 25° C. |

Copper is deposited on the exposed substrate at a rate of about 0.1 mil/hr. A thickness of about 0.5 mil is deposited. Copper does not deposit on the photoresist surfaces.

The substrate may now be stripped of photoresist and used, or the copper may be built up thicker by electroplating, or another metal may be electroplated over the copper.

EXAMPLE II

The method of the invention can also be used to deposit a pattern of metal conductors on a substrate which comprises fiberglass in an epoxy resin binder.

Prior to the deposition of the metal, the substrate is cleaned, coated with KPR photoresist, baked, exposed to a pattern of light and shadow, developed and again cleaned and then etched, all as in Example I. The board is then sensitized and activated with solutions containing 2 drops/100 mil of octyl phenol ethylene ethanol containing five ethylene oxide groups (Triton N–57).

Metal is then deposited electrolessly using any one of a number of conventional baths. A typical bath comprises:

| | |
|---|---|
| $NiSO_4 \cdot 6H_2O$ | 35 g. |
| Sodium citrate | 10 g. |
| Sodium acetate | 10 g. |
| Sodium hypophosphite | 15 g. |
| $MgSO_4$ | 20 g. |
| Water | 1,000 ml. |

This bath is preferably used at 85°–90° C.

Other nickel baths can also be used. Another preferred bath is one which is usable at room temperature. This may comprise:

| | |
|---|---|
| $NiSO_4 \cdot H_2)$ | 26 g. /l. of bath |
| $NaH_2PO_2 \cdot H_2O$ | 25 g. /l. of bath |
| $Na_4P_2O_7 \cdot 10H_0$ | 50 g. /l. of bath |
| Ammonium hydroxide containing 58 % by wt. $NH_4OH$ | 20 cc./l. of bath |

In addition to copper and nickel, other metals, such as cobalt, which can be deposited electrolessly on a substrate which has been treated with a deposition catalyst (activator) can also be selectively deposited by the method of the invention.

Besides stannous chloride, other conventional sensitizers, usually other tin compounds, can be used in the present method. Also, other activators such as platinum chloride or gold chloride can be used.

The blocking action of the wetting agent on the photoresist does not appear to be affected by the particular composition of the sensitizer, the activator or the metal being deposited.

Any conventional photoresist which is basically a synthetic resinous material or a synthetic resinlike material can be utilized in the present process. The Eastman KMER resists (polyolefins) and the Shipley "AZ-" types which are nonpolymeric, can be used.

Also, any of the insulating boards conventionally used in printed circuits, can be used in this process.

The preferred wetting agent which is of primary consideration in the present process is an octyl phenol ethylene ethanol containing 12 or 13 ethylene oxide groups. But the compound may contain five to 13 ethylene oxide groups.

Although the examples of practicing the invention have been directed to depositing a pattern of conductors on an insulating substrate, the method has also been found to be especially advantageous for depositing metal inside holes in circuit boards which are intended to connect patterns on opposite sides of the substrate or connect different layers of multilevel systems. Prior to the present invention, it was conventional to sensitize and activate an entire board including the holes. Then a resist was silk screened on the board where metal was not to be plated. One of the problems was to deposit the resist without blocking any of the holes. But this has proved difficult to do because of the problem in registering the screen with the necessary degree of precision. In the present process a photoresist is used and master patterns can be registered with a very high degree of accuracy.

We claim:

1. A method of selectively electrolessly depositing a metal on exposed areas only of an insulating substrate selected from the class consisting of ceramics and fiberglass-filled. epoxy resins having areas adjacent to said exposed areas covered with a photoresist of the type comprising a synthetic resinous material selected from the class consisting of polyvinyl cinnamate and polyolefin material, said method comprising:

a. treating both said exposed areas and said resist-covered areas with a solution of a sensitizer containing an effective amount of the order of 2 drops per 100 ml. of solution of octyl phenol ethylene ethanol containing five to 13 ethylene oxide groups, b. then treating both said exposed areas and said resist-covered areas with a solution of a deposition activator containing an effective amount of the order of 2 drops per 100 ml. of solution of octyl phenol ethylene ethanol containing five to 13 ethylene oxide groups, and then c. plating metal electrolessly on said exposed areas whereby said metal does not deposit on said resist-covered areas.

2. A method according to claim 1 in which said metal is nickel and said insulating substrate is a ceramic.

3. A method according to claim 2 in which said octyl phenol ethylene ethanol contains 12 or 13 ethylene oxide groups.

3. A method according to claim 2 in which said sensitizer is stannous chloride and said activator is palladium chloride.

* * * * *

UNITED STATES PATENT OFFICE
CERTIFICATE OF CORRECTION

Patent No. 3,640,765 Dated 2/8/72

Inventor(s) Ralph David DiStefano & Edward Anthony James

It is certified that error appears in the above-identified patent and that said Letters Patent are hereby corrected as shown below:

Col. 1, line 57 change "of" to -- or --.

Col. 2, line 20 change "$Cu(NO_3)_2.6H_2)$" to -- $Cu(NO_3)_2.6H_2O$ --.

Col. 2, line 58 change "$NiSO_4.H_2)$" to -- $NiSO_4.6H_2O$ --.

Col. 2, line 60 change "$Na_4P_2O_7.10Ho$" to -- $Na_4P_2O_7.10H_2O$ --.

Signed and sealed this 20th day of June 1972.

(SEAL)
Attest:

EDWARD M.FLETCHER,JR.
Attesting Officer

ROBERT GOTTSCHALK
Commissioner of Patents

FORM PO-1050 (10-69)

USCOMM-DC 60376-P69
☆ U.S. GOVERNMENT PRINTING OFFICE : 1969 O—366-334